United States Patent [19]

Maniscalco et al.

[11] Patent Number: 5,896,869
[45] Date of Patent: Apr. 27, 1999

[54] SEMICONDUCTOR PACKAGE HAVING ETCHED-BACK SILVER-COPPER BRAZE

[75] Inventors: Joseph Francis Maniscalco, Lake Katrine; Karen Patricia McLaughlin, Poughkeepsie; Krystyna Waleria Semkow, Poughquag, all of N.Y.

[73] Assignee: International Business Machines Corporation, Armonk, N.Y.

[21] Appl. No.: 08/784,730

[22] Filed: Jan. 13, 1997

[51] Int. Cl.⁶ ................. B08B 6/00; B23H 3/00; H01L 21/302
[52] U.S. Cl. ............ 134/1.3; 438/694; 438/754; 204/129.35; 204/129.95; 216/13
[58] Field of Search ............ 134/1.3; 204/129.35, 204/129.95; 438/694, 754; 216/13

[56] References Cited

U.S. PATENT DOCUMENTS

| | | | |
|---|---|---|---|
| 4,090,935 | 5/1978 | Dunning, Jr. et al. | 204/146 |
| 4,685,210 | 8/1987 | King et al. | 29/830 |
| 5,033,666 | 7/1991 | Keusseyan et al. | 228/122 |
| 5,387,441 | 2/1995 | Do-Thoi et al. | 427/443.2 |
| 5,491,362 | 2/1996 | Hamzehdoost et al. | 257/712 |
| 5,516,416 | 5/1996 | Canaperi et al. | 205/78 |
| 5,567,984 | 10/1996 | Zalesinski et al. | 257/697 |

FOREIGN PATENT DOCUMENTS

| | | |
|---|---|---|
| 2540652 | 3/1977 | Germany. |
| 4-308608 | 10/1992 | Japan. |

OTHER PUBLICATIONS

R. R. Tummala, et al., "Pinned Packages", Microelectronics Packaging Handbook, New York 1989, pp. 785–842.

*Primary Examiner*—William Powell
*Assistant Examiner*—George Goudreau
*Attorney, Agent, or Firm*—Steven Capella

[57] ABSTRACT

An electroetching method for removing excess silver-copper braze material from the edges of I/O pads during the manufacture of chip carriers for microelectronic devices, and the product thereby produced, are disclosed. The disclosed method is preferably self-limiting, such that braze material is preferentially removed from all regions of the assembly. The method is particularly useful for producing a desirable sidewall profile, size, and extent of coverage of the I/O pad for the fillet of braze material surrounding the base of pins in a pin grid array device. Agitation control is important for producing the desired uniformity and profile.

11 Claims, 1 Drawing Sheet

SEMICONDUCTOR PACKAGE HAVING ETCHED-BACK SILVER-COPPER BRAZE

BACKGROUND OF THE INVENTION

1. Field of the Invention

This invention generally relates packaging techniques and structures for microelectronic devices, and more particularly, to a methods and structures relating to pin grid array chip carriers.

2. Discussion of Related Art

In the fabrication of substrates and carriers for microelectronic components such as integrated circuit chips, the use of pin grid arrays (PGAs) is well known. Discussions of the background art have been published. See, for example, Rao R. Tummala and Eugene J. Rymaszewski, Microelectronics Packaging Handbook, Van Nostrand Reinhold, New York (1989), at 785, et seq. During the fabrication of a chip carrier for a PGA package, the attachment of individual pins by brazing to input/output (I/O) pads on the chip carrier substrate is also well known. The following references illustrate the state of the pertinent art.

U.S. Pat. No. 5,033,666 to Keusseyan, et al., discloses a process for brazing metallized components to ceramic substrates.

U.S. Pat. No. 5,567,984 to Zalesinski, et al., discloses a process for fabricating electronic circuit packages such as PGAs.

U.S. Pat. No. 5,491,362 to Hamzehdoost, et al., discloses package structures such as PGAs.

In the case of ceramic substrates, a number of pin brazing techniques use silver-copper (or "copper-silver") braze to attach pins to the I/O pads on the substrates. It has been found in some instances that silver migration between the I/O pads causes shorts and other disadvantages and deleterious effects. The silver migration is caused by wetting of the ceramic surface with silver in the region around the I/O pads. Subsequent nickel and gold plating over the brazed region is not sufficient to seal off the silver-copper braze at the edges of the I/O pads.

It would thus be desirable to provide a method for removing excess silver-copper braze material from chip carrier substrates to solve the aforesaid and other deficiencies and disadvantages.

SUMMARY OF THE INVENTION

An object of the present invention is to overcome the problems in the art discussed above.

Another object of the present invention is to provide an etching method which etches away excess silver-copper braze material in an inexpensive, well controlled, simple, reliable, and repeatable manner.

Yet another object of the present invention is to provide an etching method which has good etch uniformity and is highly selective towards silver and copper in a presence of nickel and Kovar.

Yet another object of the present invention is to provide an etching method which uniformly removes silver-copper material from all regions of an assembly or assemblies.

Yet another object of the present invention is to provide an etching method which is compatible with common processing steps and techniques for chip carrier fabrication.

Still, yet another object of the present invention is to teach the use of the method to produce a product.

Thus, according to the present invention, the method for etching comprises the steps of:

a) obtaining a microelectronic device comprising a substrate having at least one I/O pad thereon and at least one conductive element fixed to the I/O pad with copper-silver braze; and b) electrolytically etching the copper-silver braze with an aqueous etching solution comprising:
   a silver salt at a concentration in the range from about 2 to about 5 g/l as silver metal;
   potassium carbonate at a concentration in the range from about 15 to about 100 g/l; and potassium cyanide at a concentration in the range from about 20 to about 50 g/l, wherein the etching solution temperature is in the range from about 20 to about 30° C., the etching solution pH is in the range from about 11.5 to about 12.5, and the current density is in the range from about 50 to about 300 A/m$^2$.

The method may optionally be performed without agitation for any or all of the duration of the etching process.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

U.S. Pat. Ser. No. 5,516,416, to Canaperi, et al., and assigned to the assignee of the present invention, discloses a method for fabricating PGAs. The disclosure thereof is incorporated by reference into this application.

Figure 1:
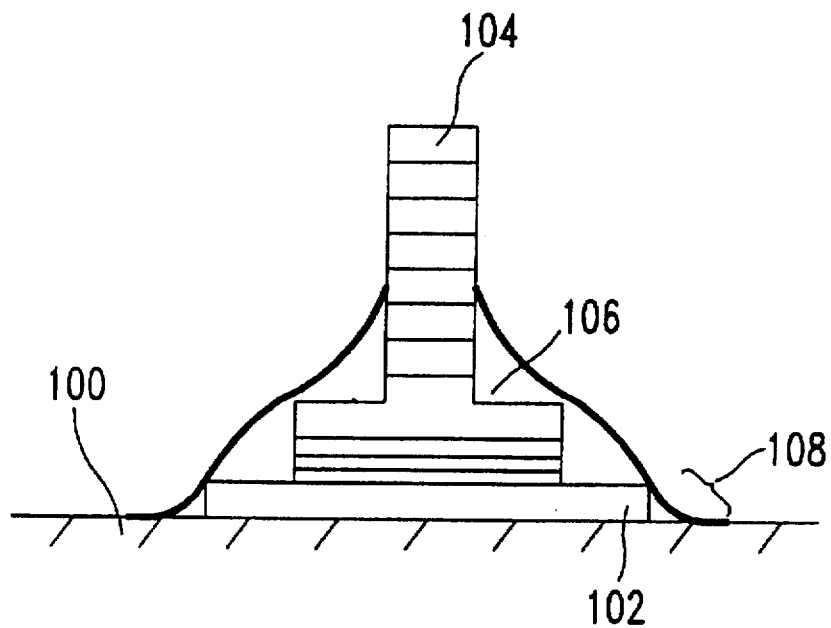
FIG. 1 shows a partial cross sectional view of a substrate, an I/O pad, and a pin brazed thereto prior to etching.

Referring to FIG. 1, there is shown a cross sectional view of a portion of a typical PGA substrate (100) having at least one I/O pad thereon (102) and at least one pin (104) brazed to the I/O pad. The braze material (106) covers at least a portion of the I/O pad and may extent beyond the edge of the pad to contact the substrate. FIG. 1 shows an intermediate product from the overall chip carrier manufacturing process, after attachment of one or more pins, but prior to etchback of the braze material.

In the present invention the substrate (100) may be an organic, inorganic or composite in nature. The preferred substrate can be a ceramic module or a multi-layer printed circuit board. The preferred ceramic substrates include silicon oxides and silicates, such as aluminum silicate, and aluminum oxides. The I/O pad (102) may be of any structure and comprise any conductive material known in the art which is compatible with the substrate and braze material, and is typically a metallic composition such as may be obtained by sintering molybdenum or tungsten paste. The preferred pad structure comprises sintered molybdenum with a nickel layer electrolessly plated thereon. Other conductive structures may be substituted for the one or more pads. Examples of such conductive structures include without limitation other deposited, plated, or sintered materials known in the art. The pin (104) may be of any structure and comprise any conductive material known in the art which is compatible with the pad and the braze material. The preferred pin structure comprises Kovar (an alloy of cobalt, nickel, and iron), nickel-comprising alloys, or Alloy 42 (an alloy of nickel and iron). Pins are attached to the substrate by a silver-copper composite brazing material. Typically, the pin and surrounding braze material is then plated. For example, the pin may be plated first with nickel, then with gold. Other conductive members may be substituted for the one or more pins. Examples of such conductive members include without limitation balls, columns, pads, and other structures understood in the art.

FIG. 1 further shows the profile of the braze material (106) after attachment of one or more pins (104), and more particularly shows that the braze material may be in contact with the substrate at one or more points (108).

It has been surprisingly found that the reliability of ceramic PGA assemblies can be improved by removing excess silver-copper braze material (106) from the edges of the I/O pads (102) prior to the pin plating step of the manufacturing process. The removal is accomplished by an electroetching process. It is preferred that the electroetching process be self-limiting, such that braze material is uniformly removed from all regions of the assembly.

Typically, the assembly to be etched is immersed in an etchant solution and DC current is then applied. The assembly to be electroetched is connected as the anode. The etchant is an aqueous solution comprising (1) a silver salt at a concentration in the range from about 2 to about 5 g/l as silver metal, (2) potassium carbonate at a concentration in the range from about 15 to about 100 g/l, and (3) potassium cyanide at a concentration in the range from about 20 to about 50 g/l. Optionally, the etchant may additionally comprise a copper salt. The purpose of the silver and/or copper salts provide a source of metal ions for deposition at a cathode.

It is desirable to select concentrations of silver and/or copper salts in the etchant in combination with the selection of electric current density so as to provide mass balance in the etchant and achieve bulk steady state concentrations during use. The upper concentration limit is selected to avoid immersion plating on assemblies to be electroetched.

In a preferred embodiment, the etchant will comprise a silver salt selected from the group consisting of silver nitrate, potassium silver cyanide, and combinations thereof. In the present invention, silver nitrate and potassium silver cyanide are considered interchangeable.

In an alternate preferred embodiment, the etchant will comprise copper cyanide. In an even more preferred embodiment, the copper salt will be substituted for about 10% to about 20% of the silver salt.

In use, the etch solution temperature is in the range from about 17 to about 35° C., the etching solution pH is in the range from about 11.5 to about 13, and the current density is in the range from about 50 to about 200 A/cm$^2$. The temperature and pH are not critical. The pH may be adjusted by adding potassium hydroxide or nitric acid as required. The current is held constant throughout the etching process, thus it is understood that the current density increases during the electroetching process. It is desirable to use lower current densities with lower concentrations of cyanide.

It has also been surprisingly found that the presence or absence of agitation before or during the electroetching process profoundly affects the results of the process. By agitation is meant the mechanical movement of the assemblies being etching within the etchant bath, and the term includes pumping, stirring, circulation, or similar flow or motion of the liquid etchant solution. It is preferred that there be little agitation of the assemblies or etchant solution while electrical current is applied. It is more preferred that there be no agitation while current is applied. It is even more preferred that agitation is used to bring the etching system and parts to be etched to equilibrium prior to the application of current, followed by ceasing the agitation during the application of current. It is thought that the mechanism for the agitation effect is as follows. After immersion of the assembly to be etched into the etchant bath, there are free cyanide ions in solution around the silver-copper braze material. Application of current to an assembly comprising the braze material which acts as an anode causes oxidation of silver and copper on a surface of the braze material and formation of cyanide complexes of copper and silver. At the same time equivalent amount of silver and copper ions are deposited at a counter electrode acting as cathode as described above. Since the electrodissolution or etching of the braze material takes place with little or no solution agitation the free cyanide concentration around braze will decrease over time during current application. Eventually, formation of cyanide complexes will stop and a passivating layer of silver and copper oxides will form on the braze material surface. The presence of such a passivating layer allows a uniform etchback of many parts per run.

The best uses and embodiments of the present invention will become apparent to the skilled artisan upon reading the following detailed examples.

COMPARATIVE EXAMPLE 1

Using a composition comprising about 5 g/l of silver nitrate and nitric acid, but not comprising a cyanide salt, a typical PGA chip carrier assembly was electroetched. Alternatively, a composition comprising silver sulfate, but not comprising a cyanide salt, was used. Such electroetching processes are undesirable because they result in poor etch uniformity, incomplete etching, and darkening of the braze material surface. It is thought that this results from quickly passivating the braze material surface after applying current and from an absence of strong complexing ligands at the surface being etched.

EXAMPLE 2

Figure 2:
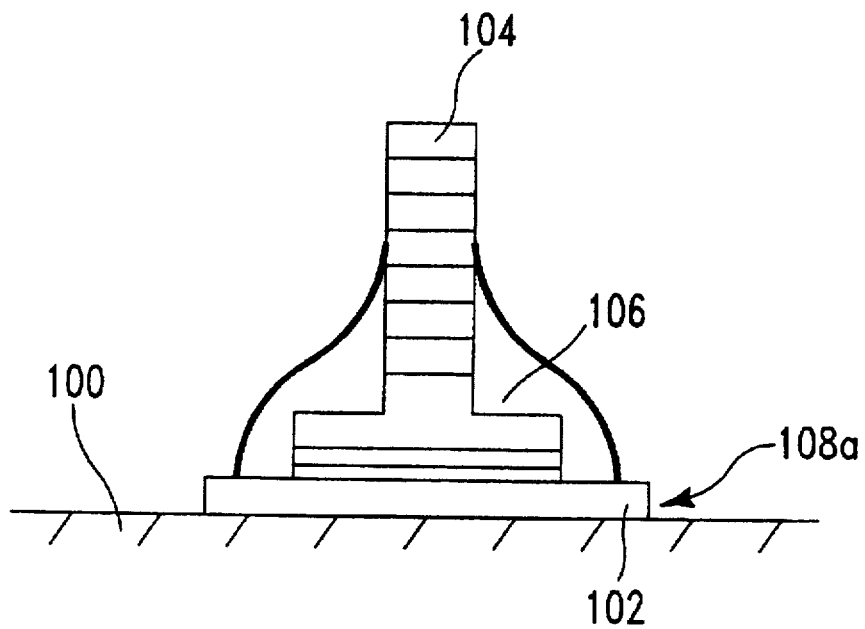
FIG. 2 shows a partial cross sectional view of a substrate, an I/O pad, and a pin brazed thereto subsequent to etching by the method of the invention.

FIG. 2 shows the results of an electroetching process described in this Example 2. Referring to FIG. 2, there is shown a cross sectional view of a portion of a substrate (100), an I/O pad (102) and a pin (104) brazed to the I/O pad. The electroetching process used in Example 2 is very uniform, such that braze material (106) has been removed from the region (108a) where it previously contacted the substrate for essentially all pins on an assembly.

The etching composition used in Example 2 comprised about 2 g/l (as silver metal) of silver nitrate and/or potassium silver cyanide, about 30 g /l of potassium cyanide, and about 15 g /l of potassium carbonate. The surface area of braze material to be etched in Example 2 is estimated to be about 30 cm$^2$/assembly. Typically about 100 assemblies may be simultaneously etched. Prior to etching, assemblies are rinsing in one or more of water and ammonium hydroxide solution. The electrodissolution process steps and associated parameters are shown in Table 1 where "Time" is the duration of a step in seconds, "Agitation" means mechanically moving the assemblies in an oscillating manner within the etch bath, "Pump" indicates whether an etch bath recirculating pump is turned on or off, and "Rectifier" indicates current in amps/assembly.

TABLE 1

| STEP | PARAMETER | NOMINAL | UPPER LIMIT | LOWER LIMIT |
|---|---|---|---|---|
| Braze Etch/Soak I | Time | 60 | 62 | 58 |
| | Agitation | ON | — | — |
| | Pump | ON | — | — |
| | Rectifier | 0.0000 | 0.0000 | 0.0000 |
| Braze Etch/Soak II | Time | 120 | 124 | 116 |
| | Agitation | OFF | — | — |
| | Pump | ON | — | — |
| | Rectifier | 0.0000 | 0.0000 | 0.0000 |
| Braze Etch/Etch | Time | 240 | 250 | 235 |
| | Agitation | OFF | — | — |
| | Pump | OFF | — | — |
| | Rectifier | 0.2680 | 0.2814 | 0.2546 |
| Braze Etch/Soak III | Time | 100 | 103 | 97 |
| | Agitation | ON | — | — |
| | Pump | ON | — | — |
| | Rectifier | 0.0000 | 0.0000 | 0.0000 |

Following the electroetching process, the assemblies are rinsed and dried. Such an electroetching process provided etched assemblies having good etch uniformity and other desirable properties.

While the invention has been particularly shown and described with reference to specific embodiments thereof, it will be understood by those skilled in the art that various changes in form and detail may be made thereto, and that other embodiments of the present invention beyond embodiments specifically described herein may be made or practiced without departing from the spirit of the invention. For example, the method disclosed herein is similarly applicable to other microelectronic packaging structures and devices. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A method for etching copper-silver braze on a microelectronic device comprising the steps of:

a) obtaining a microelectronic device comprising a substrate having at least one I/O pad thereon and at least one conductive element fixed to the I/O pad with copper-silver braze; and b) electrolytically etching the copper-silver braze with an aqueous etching solution comprising:

a silver salt at a concentration in the range from about 2 to about 5 g/l as silver metal;

potassium carbonate at a concentration in the range from about 15 to about 100 g/l; and potassium cyanide at a concentration in the range from about 20 to about 50 g/l.

wherein the etching solution temperature is in the range from about 20 to about 30° C., the etching solution pH is in the range from about 11.5 to about 12.5, and the current density is in the range from about 50 to about 300 A/m$^2$.

2. The method of claim 1 further characterized in that the etching is performed without agitation during the etching step.

3. The method of claim 2 comprising the additional step, prior to the electroetching step (b), of agitating the aqueous etching solution before applying current.

4. The method of claim 1 wherein the silver salt is selected from the group consisting of silver nitrate, potassium silver cyanide, and combinations thereof.

5. The method of claim 1 wherein the silver salt is silver nitrate.

6. The method of claim 5 wherein the aqueous etching solution comprises 2 g/l silver nitrate, 15 g/l potassium carbonate, and 30 g/l potassium cyanide.

7. The method of claim 1 wherein the silver salt is potassium silver cyanide.

8. The method of claim 7 wherein the aqueous etching solution comprises 2 g/l potassium silver cyanide, 15 g/l potassium carbonate, and 30 g/l potassium cyanide.

9. The method of claim 1 wherein the aqueous etching solution further comprises a copper salt.

10. The method of claim 9 wherein the copper salt is cuprous cyanide.

11. The method of claim 1 wherein the absolute current is held essentially constant throughout the etching process.

* * * * *